(12) United States Patent
Chen et al.

(10) Patent No.: US 11,125,807 B2
(45) Date of Patent: Sep. 21, 2021

(54) SUPPORT FIXTURE AND PROBE STATION HAVING THE SAME

(71) Applicants: Kuan-Hung Chen, Taichung (TW); Li-Cheng Richard Zai, Taipei (TW)

(72) Inventors: Kuan-Hung Chen, Taichung (TW); Li-Cheng Richard Zai, Taipei (TW)

( * ) Notice: Subject to any disclaimer, the term of this patent is extended or adjusted under 35 U.S.C. 154(b) by 143 days.

(21) Appl. No.: 16/743,649

(22) Filed: Jan. 15, 2020

(65) Prior Publication Data

US 2021/0141013 A1  May 13, 2021

Related U.S. Application Data

(60) Provisional application No. 62/931,799, filed on Nov. 7, 2019.

(51) Int. Cl.
*G01R 31/28* (2006.01)
(52) U.S. Cl.
CPC ................ *G01R 31/2808* (2013.01)
(58) Field of Classification Search
CPC ... H05K 3/1216; H05K 1/0269; H05K 3/0008
See application file for complete search history.

(56) References Cited

U.S. PATENT DOCUMENTS

| 5,461,324 A * | 10/1995 | Boyette ............ G01R 1/07328 324/73.1 |
| 6,057,695 A * | 5/2000 | Holt ...................... B25J 9/1694 324/756.05 |
| 2005/0197797 A1* | 9/2005 | Dowland ........... G01R 31/2808 702/115 |

FOREIGN PATENT DOCUMENTS

WO    WO-0203045 A2 *  1/2002  ......... G01R 1/07364

* cited by examiner

*Primary Examiner* — Alvaro E Fortich
(74) *Attorney, Agent, or Firm* — Burris Law, PLLC

(57) ABSTRACT

A support fixture is adapted for utilization of a test probe, and includes two pedestals and at least one moveable carriage assembly. Each pedestal includes a spacing block and at least one side plate connected to the spacing block extending in a longitudinal direction. The at least one moveable carriage includes a vertical panel and an adjustable holding device. The vertical panel is engaged with the at least one side plate of one of the two pedestals, and is slidable parallel to the longitudinal direction relative to the at least one side plate of each of the two pedestals. The adjustable holding device is operable for fixing the vertical panel to the at least one side plate of the one of the two pedestals and is adapted to hold the test probe.

13 Claims, 12 Drawing Sheets

SUPPORT FIXTURE AND PROBE STATION HAVING THE SAME

CROSS-REFERENCE TO RELATED APPLICATIONS

This application claims priority of U.S. Provisional Application No. 62/931,799, filed on Nov. 7, 2019.

FIELD

The disclosure relates to a set-up used with a test equipment of a printed circuit board, more particularly to a support fixture and a probe station having the same.

BACKGROUND

Referring to FIGS. 1 and 2, a conventional test equipment 1 is used for testing a printed circuit board (PCB) 9 to measure electrical signals, and includes a vertical fixture 11, a positioning plate unit 12, a probe holder 13, and a microscope 14 for magnifying and imaging. The vertical fixture 11 is used for holding the printed circuit board 9. The positioning plate unit 12 is disposed in front of the vertical fixture 11 in a front-rear direction (x), and includes a vertical support panel 121 extending in an up-down direction (z), and two fixing block assemblies 122. Each fixing block assembly 122 contains two weight blocks 123 detachably stacked in the up-down direction (z). The vertical support panel 121 is situated between the two fixing block assemblies 122 and kept vertical by the stacked weight blocks 123 without falling over. The probe holder 13 is detachably disposed on the vertical support panel 121 for testing the printed circuit board 9. The microscope 14 is disposed in front of the vertical support panel 121 and spaced from the probe holder 13 in a left-right direction (y). With the magnification of the microscope 14, the user can more accurately make electrical measurements with a probe (not shown) of the probe holder 13.

Although the probe holder 13 of the test equipment 1 can be moved to a different electrical test point at a different location by moving the supporting plate unit 12 relative to the printed circuit board 9, there are still the following shortcomings to be improved:

Firstly, the probe holder 13 and the microscope 14 are disposed at two different and unrelated positions on the left side and right side with respect to the vertical fixture 11, and cannot be moved simultaneously. Therefore, each time the probe holder 13 is moved, the microscope 14 needs to be moved accordingly and is inconvenient in use.

Secondly, the vertical support panel 121 is only held by the stacked weight blocks 123 and may become tilted when the probe holder 13 is disposed on a higher position for testing an electrical test point positioned high in the printed circuit board 9, which may result in collapse of the stacked weight blocks 123 and make the probe holder 13 falling.

Thirdly, even if the fixing block assembly 122 disposed on the rear side of the vertical support panel 121 is arranged to abut against the vertical fixture 11, there is still a clearance in the front-rear direction (x) between the probe holder 13 and the vertical fixture 11 which equals to the width of the weight block 123 in the front-rear direction (x). Therefore, an additional extension component is required to the probe holder 13 for compensating such clearance, which would result in increasing difficulty in making good electrical measurements.

Fourthly, the supporting plate unit 12 is bulky and lacks versatility, thus inhibits the usage of multi-point test and the expansion of inspection capacity that necessitate additional probe holder(s) and microscope(s).

SUMMARY

Therefore, the object of the disclosure is to provide a support fixture easy to use with stability and versatility.

Accordingly, a support fixture is adapted for utilization of a test probe. The support fixture includes two pedestals and at least one moveable carriage assembly. Each pedestal includes a spacing block and at least one side plate that is connected to the spacing block and that extends in a longitudinal direction. The at least one moveable carriage includes a vertical panel and an adjustable holding device. The vertical panel extends in a height direction substantially perpendicular to the longitudinal direction, is engaged with the at least one side plate of one of the two pedestals, and is slidable parallel to the longitudinal direction relative to the at least one side plate of each of the two pedestals. The adjustable holding device is operable for fixing the vertical panel to the at least one side plate of the one of the two pedestals and is adapted to hold the test probe.

Another object of the disclosure is to provide a probe station that has at least one abovementioned support fixture and an auxiliary fixture. the auxiliary fixture includes a bottom plate, a pair of fixing plates detachably disposed on the bottom plate, and an auxiliary vertical panel extending in the height direction and adapted for holding the test probe. the pair of fixing plates are coupled to define a positioning slot therebetween. One end of the auxiliary vertical panel extends into the positioning slot.

Another object of the disclosure is to provide a probe station that has at least one abovementioned support fixture and an adjustable magnetic base. The adjustable magnetic base is adapted for holding the test probe. The adjustable magnetic base includes a plurality of magnetic fastening members. Each magnetic fastening member is substantially rectangular in cross-section, and has four upper magnetic polarity regions on a top surface thereof that are arranged in two rows. The four upper magnetic polarity regions has two magnetic polarity regions of the north polarity that are disposed on one diagonal and two magnetic polarity regions of the south polarity that are disposed on the other diagonal. each upper magnetic polarity region has opposite polarity to that of the lower magnetic polarity region which is positioned directly thereunder in the height direction, such that rotation of one of the plurality of magnetic fastening members about an rotational axis which extends in the height direction by a rotation angle facilitates separation of the one of the plurality of magnetic fastening members from the other one that is superposed thereunder.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
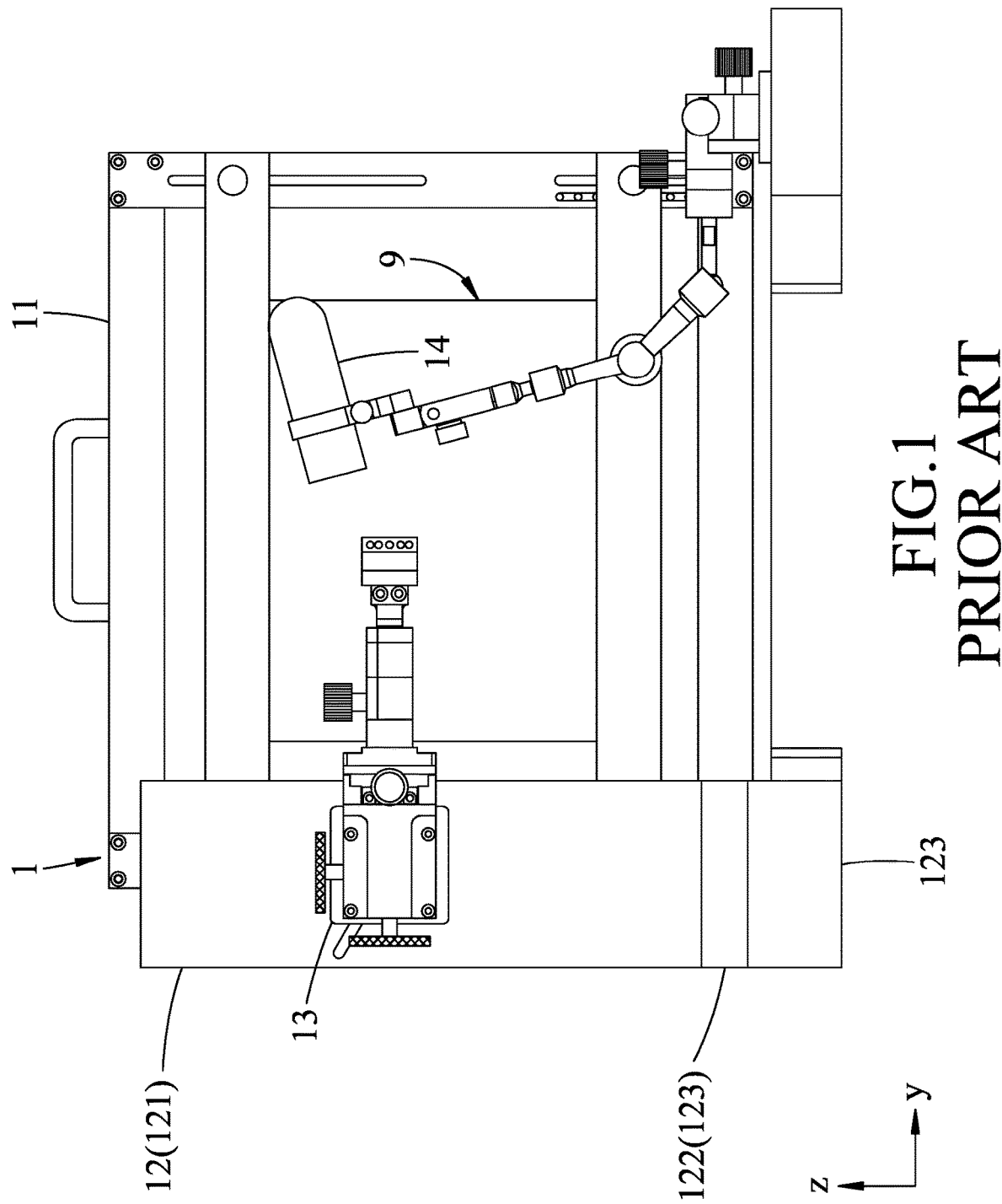
FIG. 1 is a front view of conventional test equipment.
Figure 2:
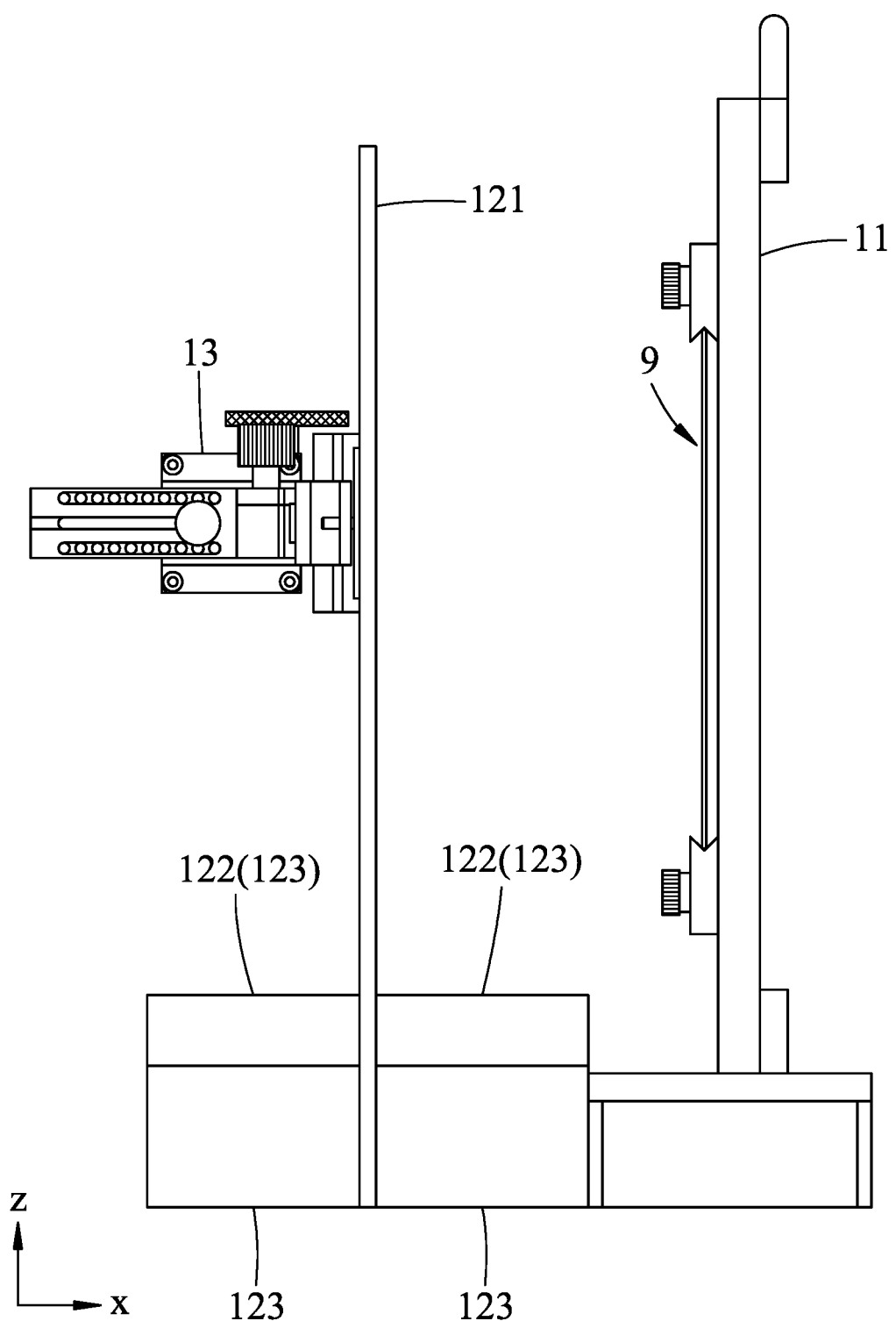
FIG. 2 is a side view of the test equipment of FIG. 1.

Before the present invention is described in greater detail, it should be noted that where considered appropriate, reference numerals or terminal portions of reference numerals have been repeated among the figures to indicate corresponding or analogous elements, which may optionally have similar characteristics.

In the following description, a longitudinal direction (X), a transverse direction (Y), and a height direction (Z) are defined according to the orientation shown in FIG. 5, and the longitudinal direction (X), the transverse direction (Y), and the height direction (Z) are substantially perpendicular to each other.

Figure 3:
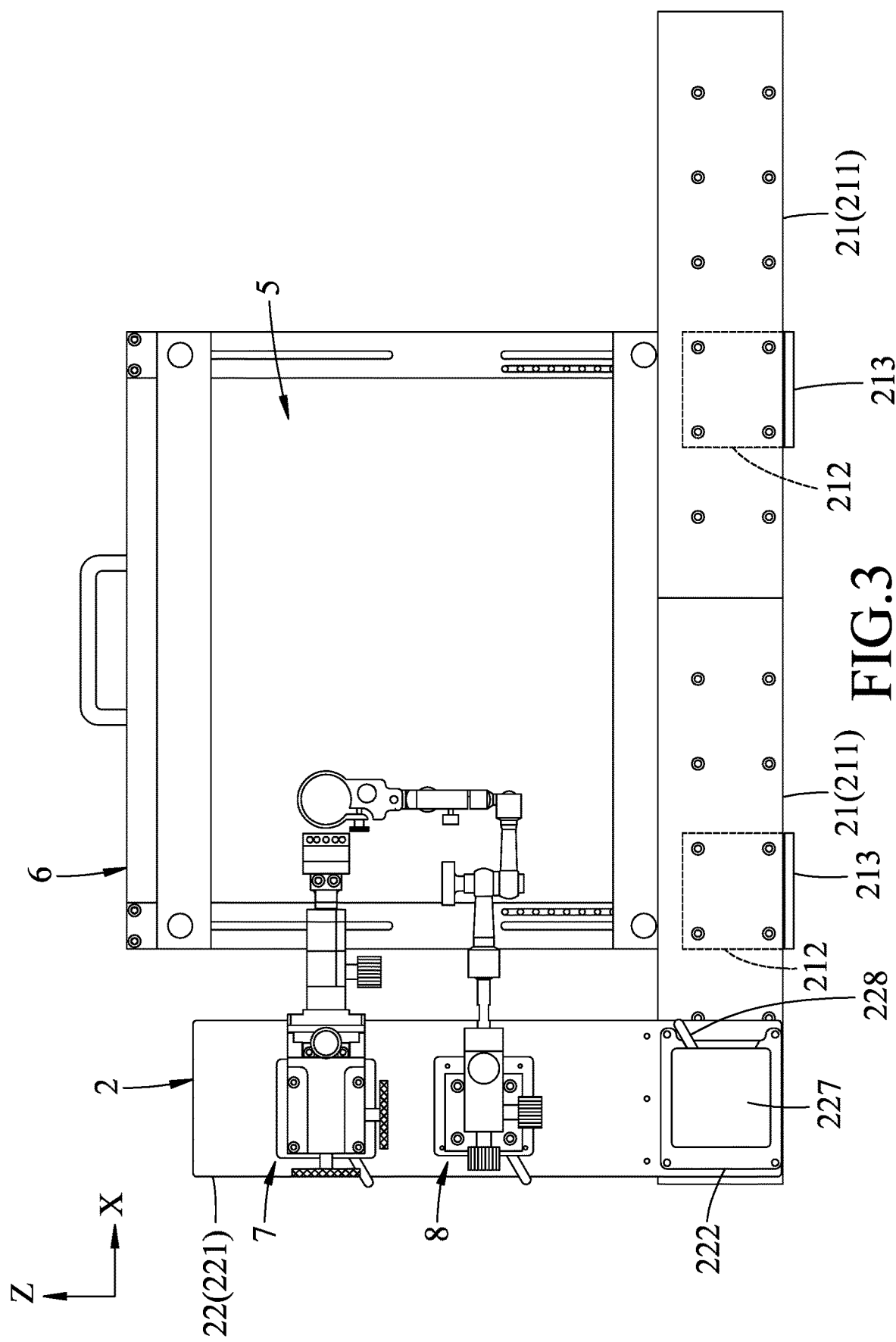
FIG. 3 is a front view showing a first embodiment of the probe station according to the present disclosure.
Figure 4:
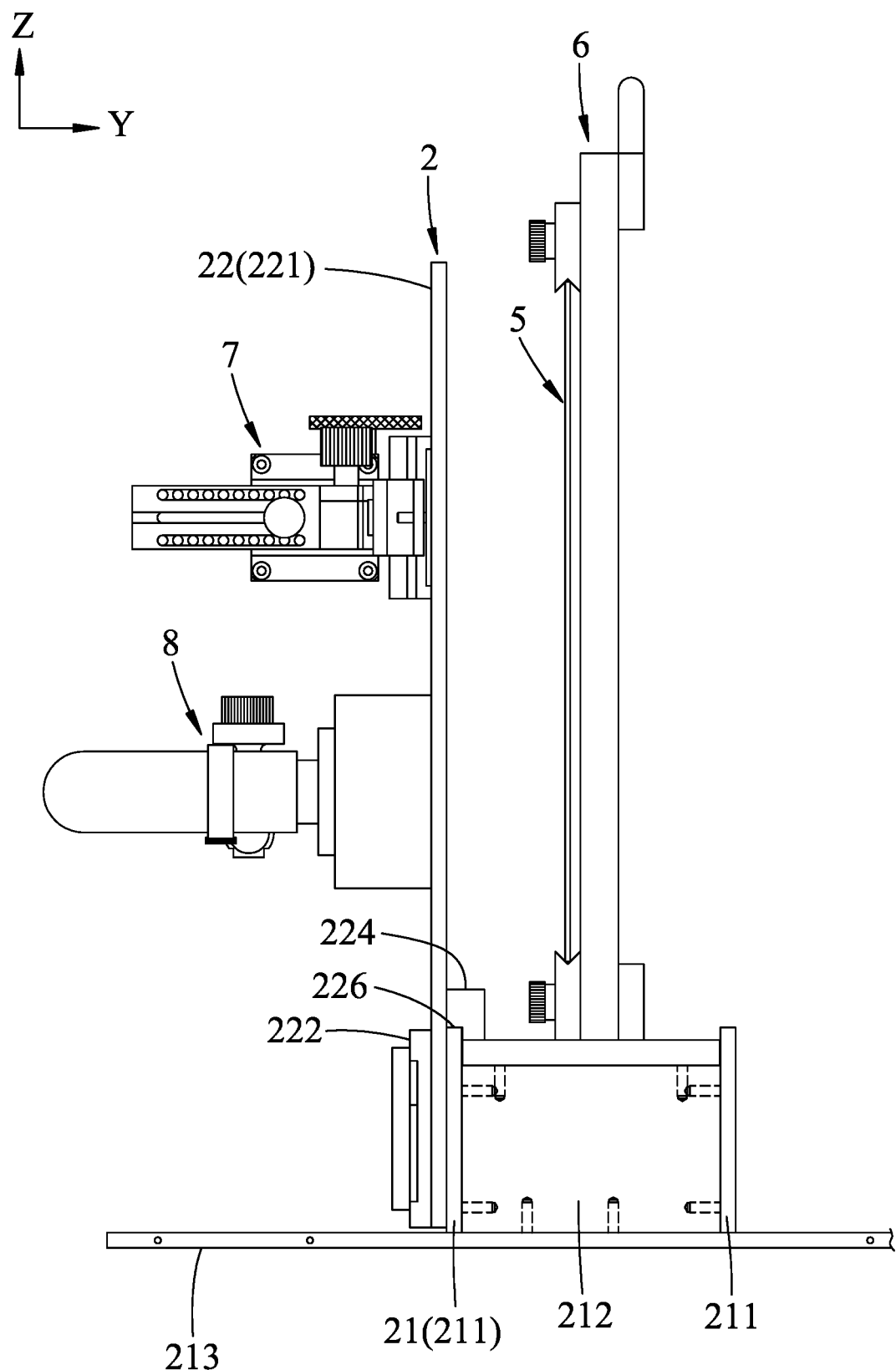
FIG. 4 is a side view of the first embodiment.
Figure 5:
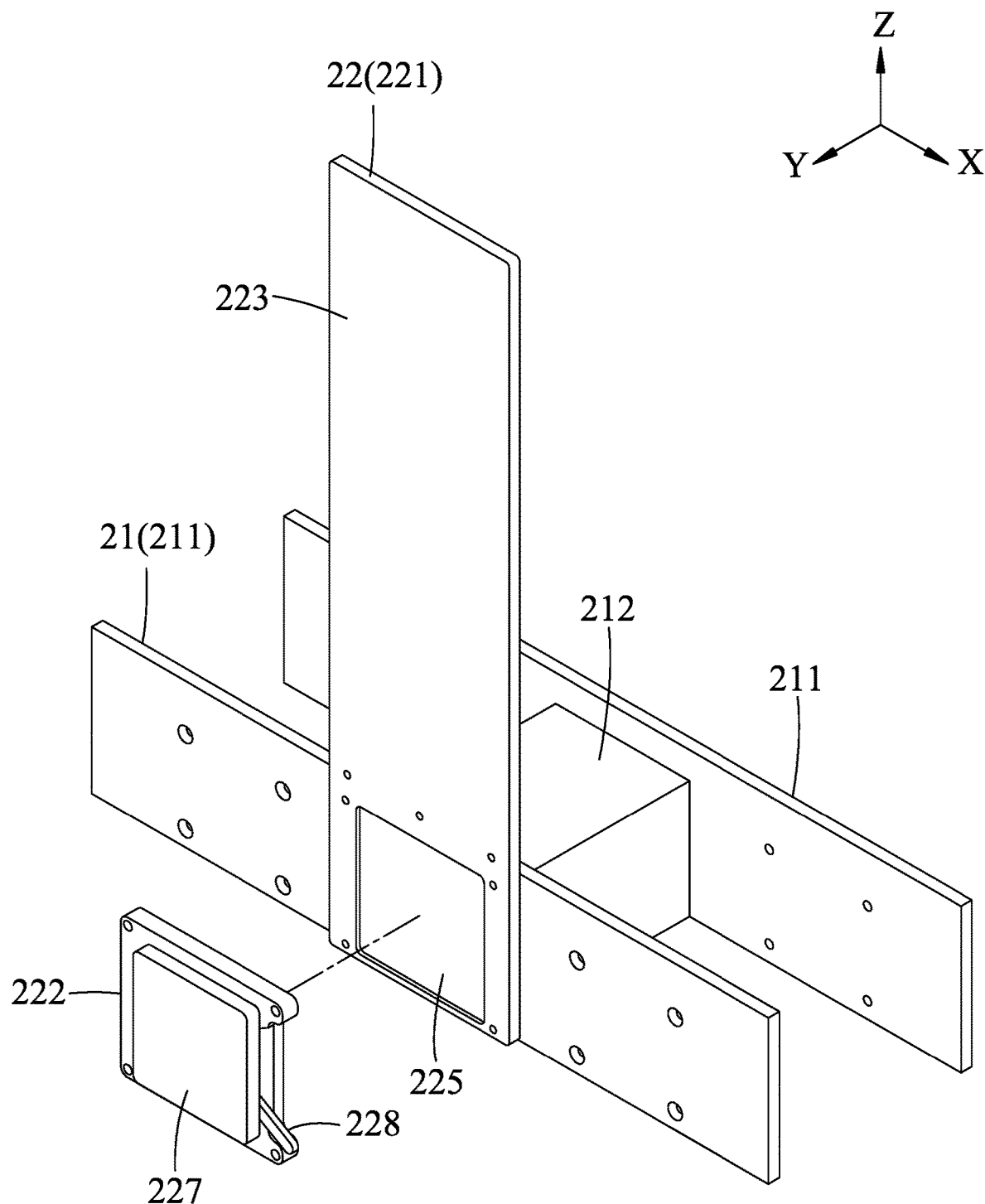
FIG. 5 is a fragmentary partly exploded perspective view showing the a support fixture of the first embodiment.

As shown in FIGS. 3 to 5, a first embodiment of the probe station according to the present disclosure includes a support fixture 2 adapted for utilization of a PCB holder 6 for a printed circuit board (PCB) 5, a test probe 7 for testing the printed circuit board 5, and a microscope 8 for magnifying and imaging, thereby enabling a user to more accurately make measurements of the printed circuit board 5 with the test probe 7. The support fixture 2 includes two pedestals 21 assembled end to end in the longitudinal direction (X) and a moveable carriage assembly 22.

Each pedestal 21 includes two side plates 211 spaced from each other in the transverse direction (Y) and extending in the longitudinal direction (X), a spacing block 212 disposed between and connected to the two side plates 211, and a base plate 213 connected to the underside of the spacing block 212 and the two side plates 211 across the transverse direction (Y). In the first embodiment, each of the two side plates 211 and the base plate 213 are bolted to the spacing block 212. The base plate 213 may be disposed with magnet(s) (not shown) so as to be magnetically affixed to a working table for a better positioning effect. In the first embodiment, the spacing block 212 of each pedestal 21 is made of aluminum-based material, such as aluminum alloy, to thereby lessen the total weight of the support fixture 2. In other embodiments, the spacing block 212 of each pedestal 21 may also be made of other rigid materials. In the first embodiment, two pedestals 21 are provided in order to extend the maximum allowed movement distance of the moveable carriage assembly 22 parallel to the longitudinal direction (X), and the PCB holder 6 is bolted to the spacing blocks 212 of the pedestals 21 for a stable gravity center. In other embodiments, the support fixture 2 may have more than two pedestals 21.

The moveable carriage assembly 22 is detachably connected to one of the two side plates 211 of one of the pedestals 21 and slidable therealong parallel to the longitudinal direction (X). The moveable carriage assembly 22 includes a vertical panel 221 extending in the height direction (Z), engaged with the one of the two side plates 211 of the one of the pedestals 21, is slidable parallel to the longitudinal direction (X) relative to the one of the two side plates 211 of the one of the pedestals 21. The moveable carriage assembly 22 further includes an adjustable holding device 222 that is operable for fixing the vertical panel 221 to the one of the two side plates 211.

The vertical panel 221 has a ferromagnetic panel body 223 for magnetically holding the test probe 7 and the microscope 8, and a slider piece 224 attached to a side of the panel body 223 opposite to the test probe 7 and the microscope 8, and slidably engaged with the one of the two side plates 211 of the one of the pedestals 21. The panel body 223 has a perforation 225 that is formed next to the one of the two side plates 211 of the one of the pedestals 21, and that extends therethrough in the transverse direction (Y). The slider piece 244 is substantially inverted L-shaped, and has an engaging groove 226 extending therethrough in the longitudinal direction (X) for sliding engagement with the upper side of the one of the two side plates 211 of the one of the pedestals 21. In the first embodiment, the engaging groove 226 is exemplified to be formed in the slider piece 224. In other embodiments, however, the engaging groove 226 may be formed in the one of the side plates 211 to be engaged with a protrusion of the slider piece 224.

In the first embodiment, the adjustable holding device 222 is magnetically-controllable for detachably and magnetically attracting the one of the two side plates 211. The adjustable holding device 222 includes a magnetic structure body 227 extending through the perforation 225 of the panel body 223 and abutting against the one of the two side plates 211, and a rotatable operating handle 228 associated with the magnetic structure body 227 for controlling the magnetic attraction of the magnetic structure body 227. In particular, a clockwise rotation of the operating handle 228 down to the end will maximize the magnetic attraction of the magnetic structure body 227, such that the vertical panel 221 can be held tightly between the adjustable holding device 222 and the one of the two side plates 211, and a counterclockwise rotation of the operating handle 228 will decrease the magnetic attraction of the magnetic structure body 227 such that the adjustable holding device 222 can be detached from the vertical panel 221.

In use, the moveable carriage assembly 22 carrying the test probe 7 and the microscope 8 is slided along the two side plates 211 of the two pedestals 21 to be aligned with the test point of the printed circuit board 5, and then the operating handle 228 of the adjustable holding device 222 is pushed clockwise to maximize the magnetic attraction of the magnetic structure body 227 so that the adjustable holding device 222 firmly attracts one of the two side plates 211, with the vertical panel 221 being held between the adjustable holding device 222 and that one of the two side plates 211. At this time, the printed circuit board 5 can be measured by the test probe 7 with the help of the microscope 8. By moving the moveable carriage assembly 22, the test probe 7 and the microscope 8 can be moved at the same time to a next test position, which is more time-saving and convenient to use.

It should be noted that, in the first embodiment of the present disclosure, the PCB holder 6 is mounted between the two side plates 211 of each of the pedestals 21, so that the clearance between the moveable carriage assembly 22 and the printed circuit board 5 can be reduced compared to that of prior art, and no additional extension component is required. However, in other embodiments, the relative position of the pedestals 21 and the PCB holder 6 can be adjusted according to different usage requirements, and is not limited thereto. In the first embodiment, each pedestal 21 has two side plates 211 spaced apart in the transverse direction (Y) and disposed respectively at two sides of the printed circuit board 5. The moveable carriage assembly 22 can be detachably connected to either of the two side plates 211 for performing measurements on either of both sides of the printed circuit board 5. In other embodiments, each pedestal 21 may include only one side plate 211 which can be removed from one side of the spacing block 212 and connected to the other side of the spacing block 212 side plate 211, thus enabling measurements of the other side of the printed circuit board 5. Further, although in the first embodiment, the support fixture 2 includes only one moveable carriage assembly 22, two or more moveable carriage assembly 22 may be included in other embodiments to provide more test probes 7 and microscopes 8 in order to increase the measurement capacity.

Through configuration that the moveable carriage assembly 22 is slidable parallel to the longitudinal direction (X), the position of the test probe 7 relative to the printed circuit board 5 in the longitudinal direction (X) can be adjusted, without relocating the support base 21 or the moveable carriage assembly 22. And, the vertical panel 221 can be magnetically affixed to any one of the side plates 211 of the pedestals 21 through the adjustable holding device 222, thus providing improved stability and convenience in use.

Figure 6:
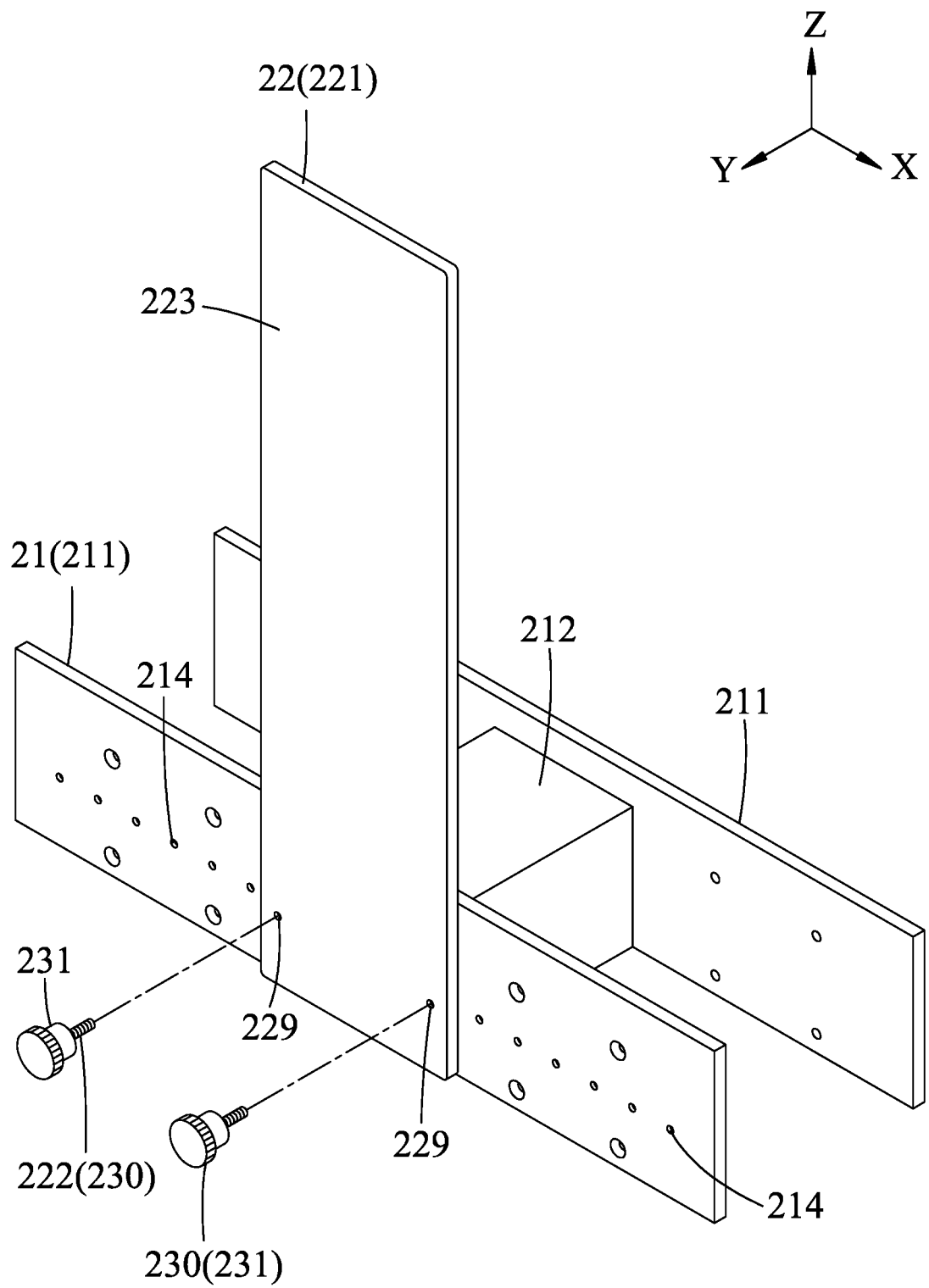
FIG. 6 is a fragmentary partly exploded perspective view showing a second embodiment of the probe station according to the present disclosure.

Referring to FIG. 6, a second embodiment of the probe station according to the present disclosure has a structure similar to that of the first embodiment. The differences between the embodiment and the first embodiment resides in the following.

The panel body 223 of the vertical panel 221 is not provided with the perforation 225 as disclosed in the previous embodiment, and has two first positioning holes 229 spaced apart in the longitudinal direction (X) and extending in the transverse direction (Y). Each side plate 211 of the pedestals 21 has a plurality of second positioning holes 214 spaced apart in the longitudinal direction (X). The adjustable holding device 222 includes two locking bolts 230, each having a head portion 231.

When the moveable carriage assembly 22 is to be fixed, each of the locking bolts 230 can be manually screwed through a respective one of the first positioning holes 229 and into a corresponding one of the second positioning holes 214 of a corresponding one of the side plates 211 with the head portion 231 thereof abutting tightly against the vertical panel 221, thereby clamping the vertical panel 221 against corresponding side plates 211. Accordingly, the second embodiment has the same effect as the first embodiment.

However, in other embodiments, the second positioning holes 214 may be omitted. Each of the locking bolts 230 may be screwed through a respective one of the first positioning holes 229 and directly abut against a corresponding one of the side plates 211 to clamp the vertical panel 221 tightly against corresponding side plates 211.

Figure 7:
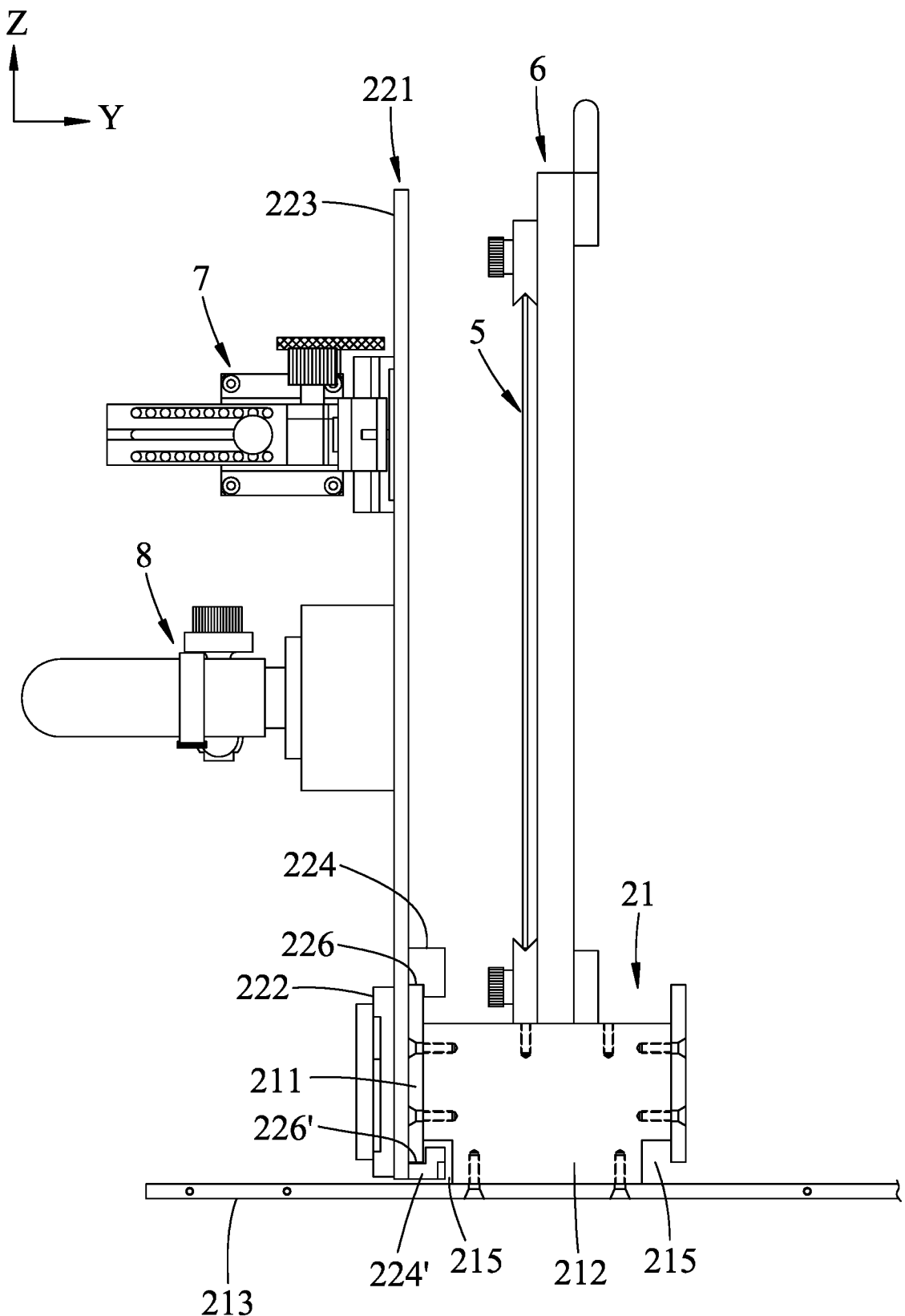
FIG. 7 is a side view of a third embodiment of the probe station according to the present disclosure.

Referring to FIG. 7, a third embodiment of the probe station according to the present disclosure is structurally similar to that of the first embodiment. The main difference between this embodiment and the first embodiment resides in the following.

In this embodiment, the spacing block 212 of each of the pedestals 21 has two slide grooves 215 that are formed in a bottom end of the spacing block 212, that are spaced apart from each other in the transverse direction (Y), that extend in the longitudinal direction (X), and that open respectively toward the side plates 211.

In addition to the slider piece 224, the vertical panel 221 further has a slider block 224' attached to the panel body 223. The slider piece 224 is disposed above the slider block 224' in the height direction (Z). The slide block 224' is substantially L-shaped, and has an engaging groove 226' that extends therethrough in the longitudinal direction (X) for sliding engagement with a lower side of the one of the two side plates 211 of the one of the pedestals 21. Additionally, the slide block 224' is slidably engaged with one of the slide grooves 215 of the spacing block 212 of the one of the pedestals 21. With the presence of the slider block 224', the structural stability between the vertical panel 221 and the one of the pedestals 21 can be further improved.

Figure 8:
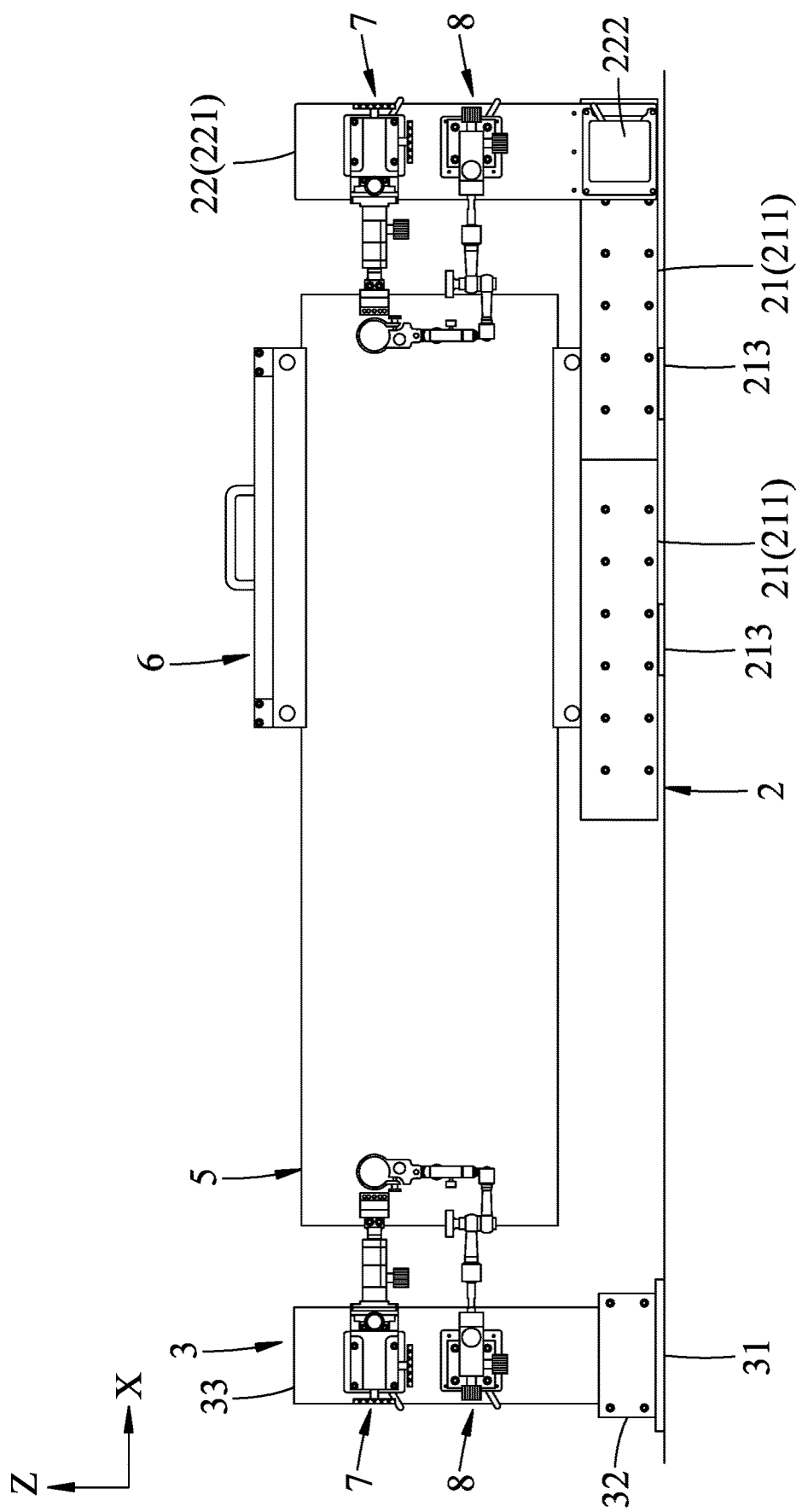
FIG. 8 is a front view illustrating a fourth embodiment of the probe station according to the present disclosure.
Figure 9:
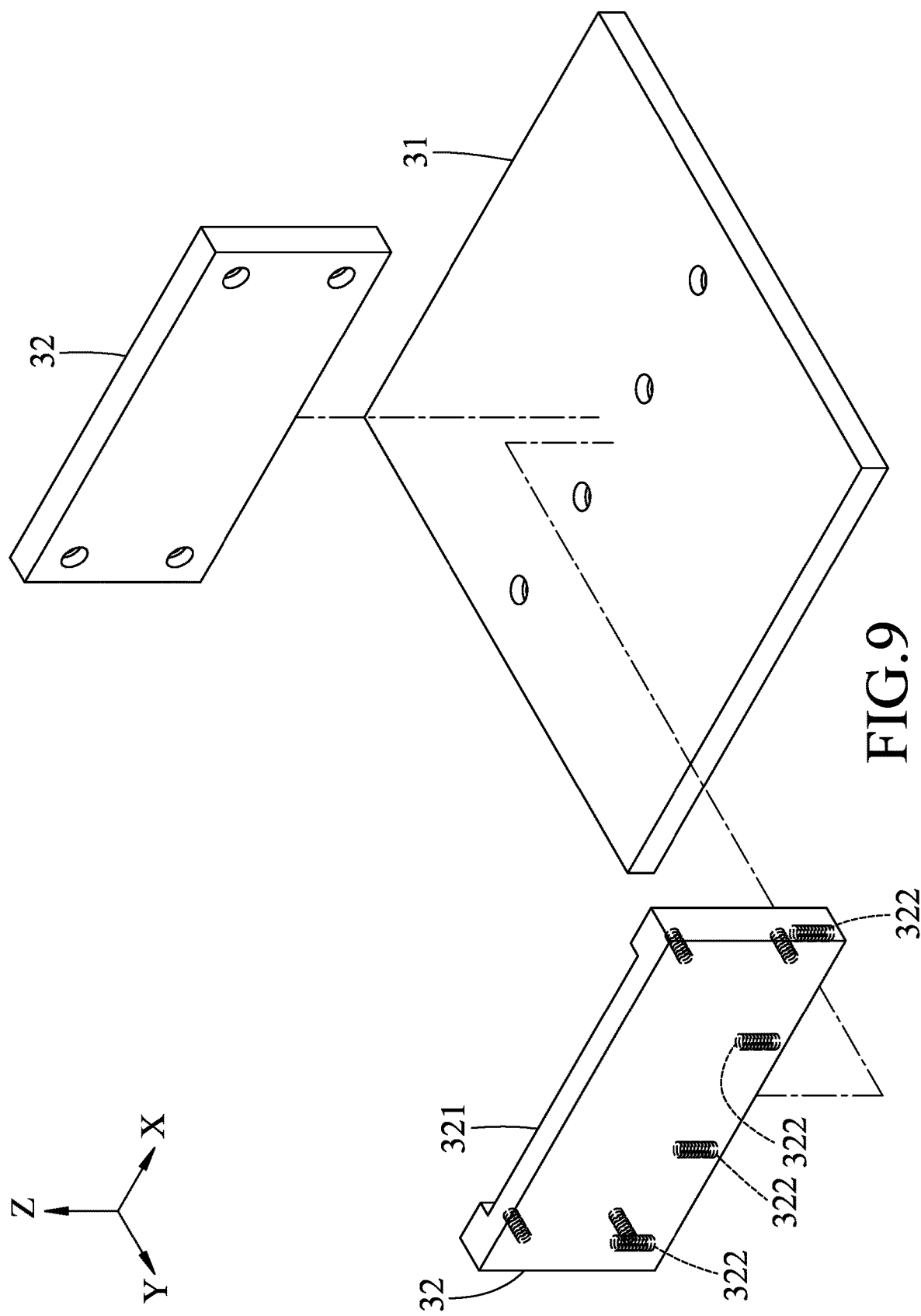
FIG. 9 is an exploded perspective view of an auxiliary fixture of the fourth embodiment, in which an auxiliary vertical panel is omitted.

As shown in FIGS. 8 and 9, a fourth embodiment of the probe station according to the present disclosure is structurally similar to that of the first embodiment. The main difference between this embodiment and the first embodiment resides in the following.

In addition to the support fixture 2, the fourth embodiment of the probe station further includes an auxiliary fixture 3. The auxiliary fixture 3 includes a bottom plate 31, a pair of fixing plates 32 detachably disposed on the bottom plate 31, a number of bolts (not shown) for fastening the bottom plate 31 and the fixing plates 32, and an auxiliary vertical panel 33 held between the pair of fixing plates 32 and extending in the height direction (Z). The pair of fixing plates 32 are coupled with bolts to define a positioning slot 321 therebetween extending in the height direction (Z). In the fourth embodiment, one of the two fixing plates 32 has a number of bolt holes 322 facing the bottom plate 31 for the bolts to screw into. However, the one of the fixing plates 32 may also have only one bolt hole 322 for a single bolt to achieve a similar effect of fastening the bottom plate 31 with the pair of fixing plates 32. One end of the auxiliary vertical panel 33 extending into the positioning slot 321, such that the auxiliary vertical panel 33 can be used for holding an additional test probe 7 and an additional microscope 8.

In the fourth embodiment, the auxiliary fixture 3 is disposed at distance from the support fixture 2, and the additional test probe 7 and the additional microscope 8 are fixed on the auxiliary vertical panel 33 of the auxiliary fixture 3, so that it is possible to measure a lengthy printed circuit board 5 that is longer than the total length of the pedestals 21 of the support fixture 2. In addition to the same functions as the first embodiment, the fourth embodiment can achieve the effect of increasing the measurement range.

Figure 10:
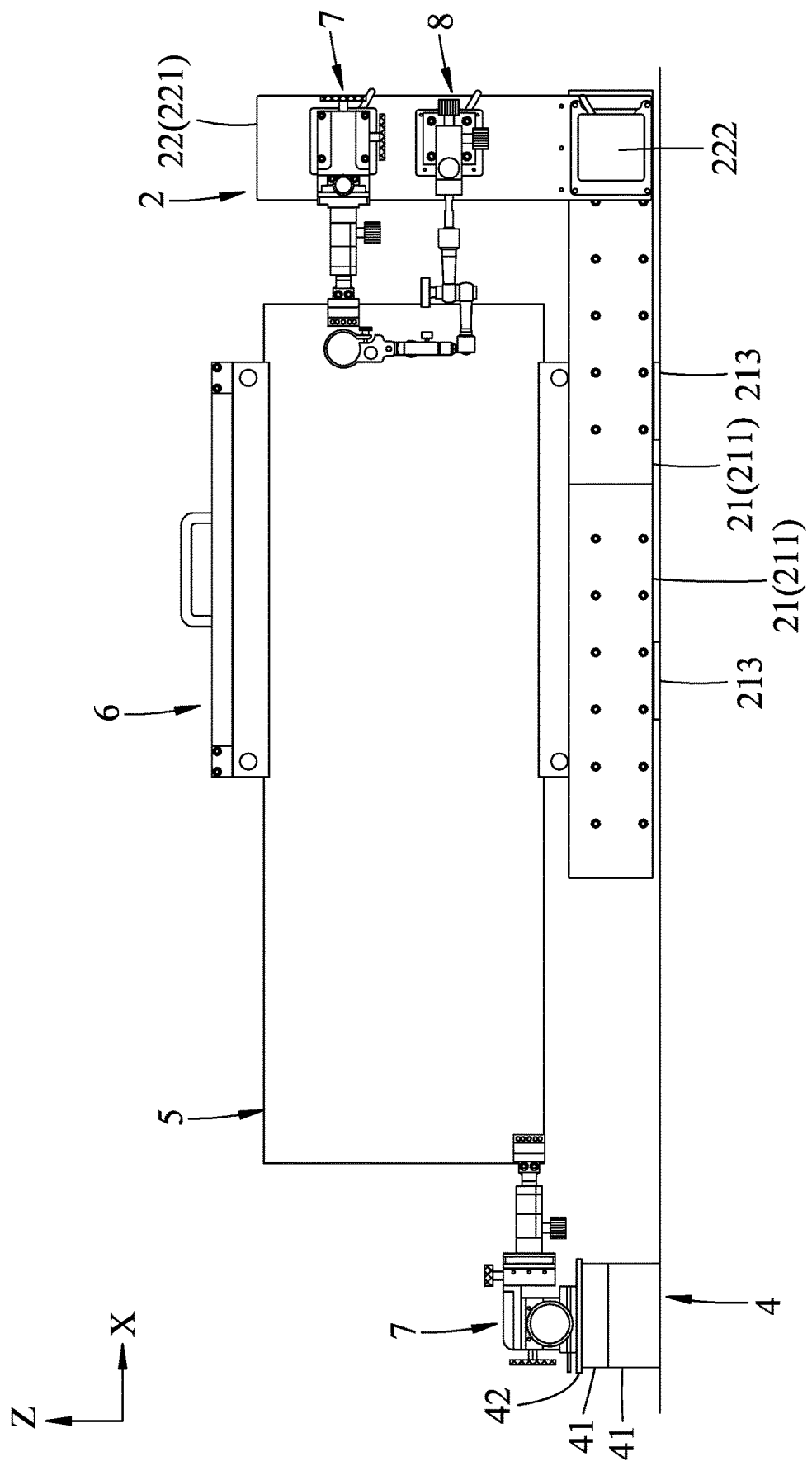
FIG. 10 is a front view illustrating a fifth embodiment of the probe station according to the present disclosure.
Figure 11:
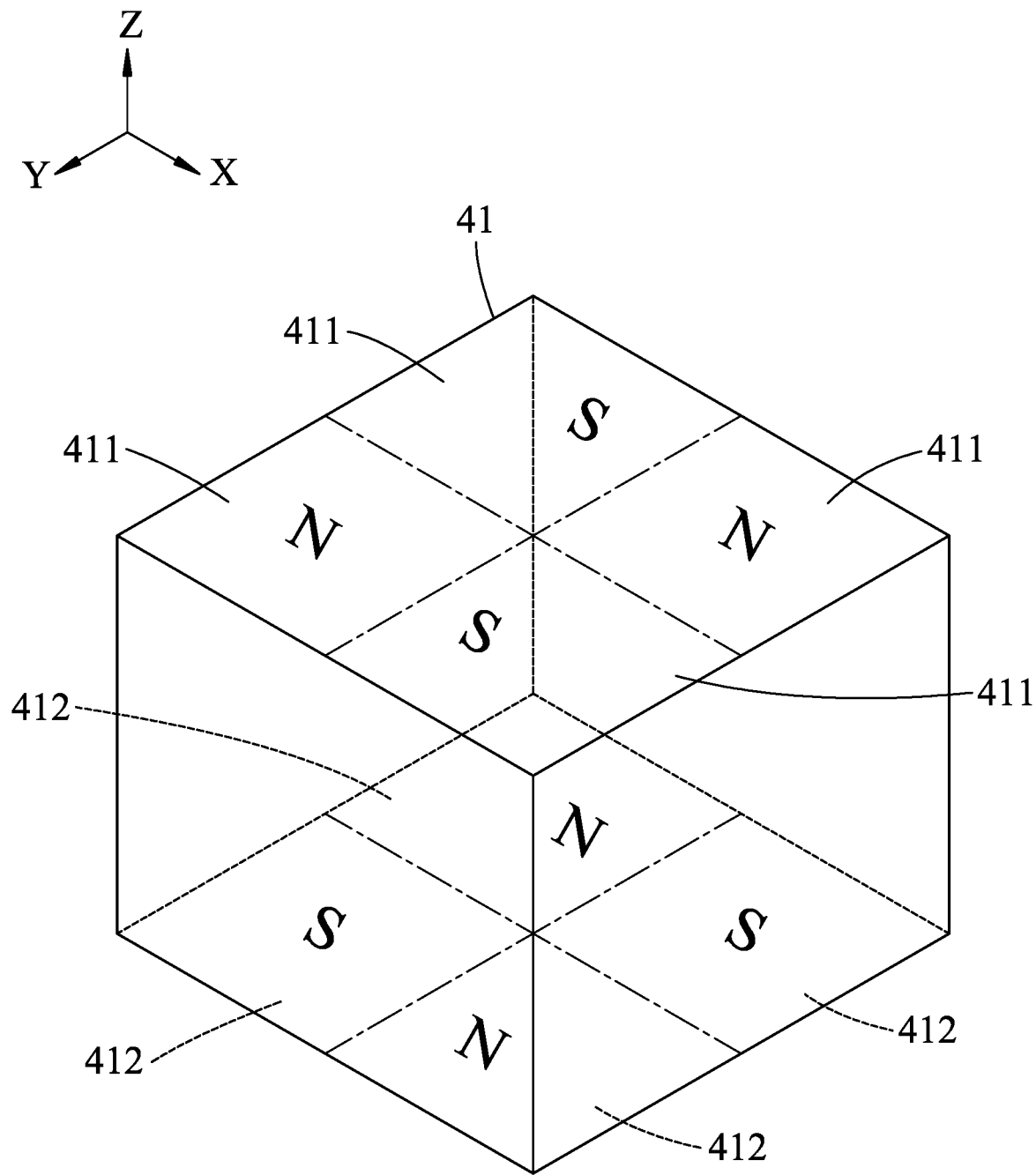
FIG. 11 is a perspective view of a magnetic fastening member of an adjustable magnetic base included in the fifth embodiment.
Figure 12:
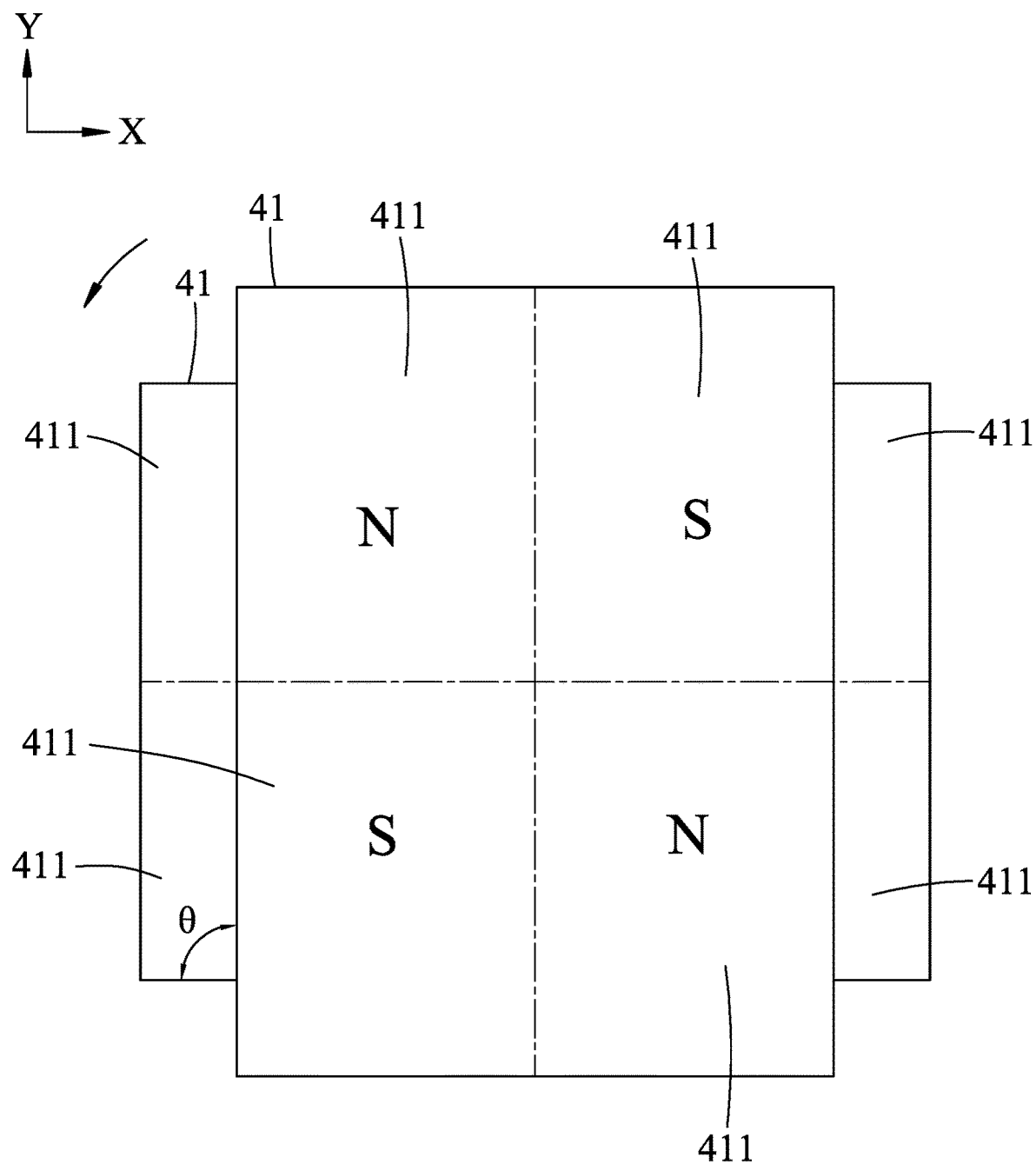
FIG. 12 is a top view showing a magnetic fastening member being rotated at an angle relative to another magnetic fastening member.

As shown in FIGS. 10 to 12, the fifth embodiment of the probe station according to the present disclosure is structurally similar to that of the first embodiment. The main difference between this embodiment and the first embodiment resides in the following.

In addition to the support fixture 2, the fifth embodiment of the probe station further includes an adjustable magnetic base 4 for holding an additional test probe 7. The adjustable magnetic base 4 includes a plurality of magnetic fastening members 41 and a ferromagnetic partition 42.

The magnetic fastening members 41 are superposed one on the other. Each magnetic fastening member 41 is substantially rectangular in cross-section, and has four upper magnetic polarity regions 411 on a top surface thereof that are arranged in two rows, and four lower magnetic polarity regions 412 on a bottom surface thereof that are arranged in two rows. The four upper magnetic polarity regions 411 have two magnetic polarity regions of the north polarity that are disposed on one diagonal and two magnetic polarity regions of the south polarity that are disposed on the other diagonal. Each upper magnetic polarity region 411 has opposite polarity to that of the lower magnetic polarity region 412 which is disposed directly thereunder.

In the fifth embodiment, the ferromagnetic partition 42 is magnetically attracted to the uppermost magnetic fastening member 41 for fixing the additional test probe 7 through an adjustable magnetic fastening mechanism equipped to the additional test probe 7, and the adjustable magnetic fastening mechanism is similar to the adjustable holding device 222. Therefore, the presence of the ferromagnetic partition 42 can prevent possible magnetic repelling interaction when the additional test probe 7 is brought to the uppermost magnetic fastening member 41 with a particular polarity orientation of the adjustable magnetic fastening mechanism. The microscope 8 is provided for assisting the user to touch the electrical contact to be tested with the test point more accurately, and it is optional and can be omitted.

Since each of the magnetic fastening members 41 is structurally made up of strong magnets, they cannot be separated easily. Any one of the magnetic fastening members 41 intended to be separated should be rotated about an rotational axis which extends in the height direction (Z) by a rotation angle (θ) relative to the other one superposed thereunder, thereby generating a repelling force between the lower magnetic polarity regions 412 thereof and the upper magnetic polarity regions 411 of the other magnetic fastening member 41 superposed thereunder to facilitate separation of the one of the magnetic fastening members 41 from the other one superposed thereunder. In this embodiment, the rotation angle (θ) substantially equals to 90 degrees.

In addition to the same functions as the first embodiment, the fifth embodiment can achieve the effect of increasing the measurement range and versatility of usage.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A support fixture adapted for utilization of a test probe, said support fixture comprising:

two pedestals, each pedestal including a spacing block and at least one side plate that is connected to said spacing block and that extends in a longitudinal direction; and at least one moveable carriage assembly including
        a vertical panel that extends in a height direction substantially perpendicular to said longitudinal direction, that is engaged with said at least one side plate of one of said two pedestals, that is slidable parallel to the longitudinal direction relative to said at least one side plate of each of said two pedestals, and that is adapted for holding the test probe, and
        an adjustable holding device that is operable for fixing said vertical panel to said at least one side plate of said one of said two pedestals.

2. The support fixture as claimed in claim 1, wherein said vertical panel has a panel body for holding said test probe, and a slider piece attached to said panel body and slidably engaged with said at least one side plate of said one of said two pedestals.

3. The support fixture as claimed in claim 2, wherein said slider piece has an engaging groove extending therethrough in said longitudinal direction for sliding engagement with said at least one side plate of said one of said two pedestals.

4. The support fixture as claimed in claim 2, wherein said adjustable holding device is magnetically-controllable for detachably and magnetically attracting said at least one side plate of said one of said two pedestals, said panel body of said vertical panel having a perforation that is adjacent to said at least one side plate of said one of said two pedestals, said adjustable holding device having a magnetic structure body that extends through said perforation and that abuts against said at least one side plate of said one of said two pedestals, and a rotatable operating handle that is disposed for controlling the magnetic attraction of said magnetic structure body.

5. The support fixture as claimed in claim 1, wherein said panel body of said vertical panel has a plurality of first positioning holes spaced apart in said longitudinal direction and extending in a transverse direction which is substantially perpendicular to the longitudinal direction and the height direction, said adjustable holding device including a plurality of locking bolts that extend respectively through said first positioning holes to clamp said vertical panel against said at least one side plate of said one of said pedestals.

6. The support fixture as claimed in claim 5, wherein said at least one side plate of each of said two pedestals has a plurality of second positioning holes spaced apart in said longitudinal direction, each locking bolt having a head portion, and extending through a respective one of said first positioning holes and into a corresponding one of said second positioning holes with said head portion thereof abutting tightly against said vertical panel so as to clamp said vertical panel against said at least one side plates of said one of said pedestals.

7. The support fixture as claimed in claim 1, wherein each pedestal further includes a base plate connected to the underside of said spacing block and said at least one side plate across a transverse direction that is substantially perpendicular to said longitudinal direction and said height direction.

8. The support fixture as claimed in claim 1, wherein said spacing block of each pedestal is made of aluminum-based material.

9. The support fixture as claimed in claim 1, wherein:
    said spacing block of each of said pedestals has at least one slide groove that is formed in a bottom end of said spacing block, that extends in the longitudinal direction, and that opens toward said at least one side plate;

said vertical panel has a panel body that is adapted for holding the test probe, and a slider piece and a slider block that are attached to said panel body, said slider block having an engaging groove that extends therethrough in the longitudinal direction for sliding engagement with a lower side of said at least one side plate of said one of said two pedestals, said slider piece being disposed above said slider block in the height direction and having an engaging groove that extends therethrough in the longitudinal direction for sliding engagement with an upper side of said at least one side plate of said one of said two pedestals; and said slider block is slidably engaged with said at least one slide groove of said spacing block of one of said pedestals.

10. A probe station adapted for measurements with a test probe, said probe station comprising:

at lease one support fixture as claimed in claim 1; and an auxiliary fixture that includes a bottom plate, a pair of fixing plates detachably disposed on said bottom plate, and an auxiliary vertical panel extending in said height direction and adapted for holding a test probe, said pair of fixing plates being coupled to define a positioning slot therebetween, one end of said auxiliary vertical panel extending into said positioning slot.

11. The probe station as claimed in claim 10, wherein one of said pair of fixing plates has at least one bolt hole facing said bottom plate.

12. A probe station adapted for measurements with a test probe, comprising:

at least one support fixture as claimed in claim 1; and an adjustable magnetic base adapted for holding a test probe, said adjustable magnetic base including a plurality of magnetic fastening members, each magnetic fastening member being substantially rectangular in cross-section, and having four upper magnetic polarity regions on a top surface thereof that are arranged in two rows and four lower magnetic polarity regions on a bottom surface thereof that are arranged in two rows, said four upper magnetic polarity regions having two magnetic polarity regions of the north polarity that are disposed on one diagonal and two magnetic polarity regions of the south polarity that are disposed on the other diagonal, each upper magnetic polarity region having opposite polarity to that of said lower magnetic polarity region which is positioned directly thereunder, such that rotation of one of said plurality of magnetic fastening members about an rotational axis which extends in the height direction by a rotation angle facilitates separation of said one of said plurality of magnetic fastening members from the other one that is superposed thereunder.

13. The probe station as claimed in claim 12, wherein said rotation angle substantially equals to 90 degrees.

* * * * *